(12) United States Patent
Braun et al.

(10) Patent No.: US 6,443,322 B1
(45) Date of Patent: Sep. 3, 2002

(54) WALL MOUNT ENCLOSURE HAVING INSTALLATION FEATURES FOR MULTIPLE SEPARATELY-INSTALLED COMPONENTS

(75) Inventors: Willie Braun, Franklin Lake; Kan Liu, New York, both of NY (US); Albert Pedoeem, West Orange; Noha El-Ghobashy, Fort Lee, both of NJ (US)

(73) Assignee: Fujitsu Network Communications, Inc., Richardson, TX (US)

( * ) Notice: Subject to any disclaimer, the term of this patent is extended or adjusted under 35 U.S.C. 154(b) by 28 days.

(21) Appl. No.: 09/692,301

(22) Filed: Oct. 19, 2000

(51) Int. Cl.[7] .................................................. H05K 5/00
(52) U.S. Cl. ..................... 220/4.02; 174/50; 312/223.1; 361/600
(58) Field of Search .......................... 220/4.02; 174/50; 312/223.1; 361/600

(56) References Cited

U.S. PATENT DOCUMENTS

| | | | | |
|---|---|---|---|---|
| 5,147,981 A | * | 9/1992 | Buet et al. ............. 220/4.02 X |
| 5,593,219 A | * | 1/1997 | Ho .................... 220/4.02 X |
| 5,621,387 A | * | 4/1997 | Phillips et al. ......... 220/4.02 X |
| 6,060,660 A | * | 5/2000 | Bauer ................ 220/4.02 X |
| 6,145,683 A | * | 11/2000 | Taniguchi .............. 220/4.02 |
| 6,191,358 B1 | * | 2/2001 | Daoud ................ 220/4.02 X |

* cited by examiner

*Primary Examiner*—Steven Pollard
(74) *Attorney, Agent, or Firm*—Weingarten, Schurgin, Gagnebin & Lebovici LLP (57) ABSTRACT

An equipment enclosure includes a set of features enabling alignment of an electronic component with an L-shaped wall bracket. The bottom of the component rests on a base of the bracket. A rear wall of the bracket includes fastener elements, such as threaded standoffs, and alignment posts that extend forward beyond the standoffs. The rear of the component likewise includes fastener elements, such as captive screws, and alignment openings. During installation, the component is brought into a position in which the alignment openings engage the alignment posts, and then the component is pushed rearward until it abuts the rear wall of the bracket. The fasteners become mutually aligned for subsequent fastening.

12 Claims, 5 Drawing Sheets

WALL MOUNT ENCLOSURE HAVING INSTALLATION FEATURES FOR MULTIPLE SEPARATELY-INSTALLED COMPONENTS

CROSS REFERENCE TO RELATED APPLICATIONS

None

STATEMENT REGARDING FEDERALLY SPONSORED RESEARCH OR DEVELOPMENT

Not Applicable

BACKGROUND OF THE INVENTION

The present invention is related to the field of enclosures for electronic equipment.

It is common for equipment enclosures to house multiple electronic components or related items. For example, in the field of data communications, equipment items such as add/drop multiplexers have incorporated a card cage, a DC power supply, and other components. While some equipment items are assembled only in a manufacturing facility, others are intended for final assembly at a customer's site or similar location. It is desirable that the installation of components into the enclosures of such items be simple and "robust", in the sense that the chances of having components misaligned or otherwise installed incorrectly is minimized as much as possible.

Many equipment items are intended to be mounted on a wall, and accordingly present unique difficulties in the installation process. In particular, it may be necessary to lift and maneuver heavy components into position in a wall-mounted enclosure and maintain the components in this position until secured within the enclosure. It may be difficult for installation personnel to maintain the position of such an item to assure proper alignment and installation.

BRIEF SUMMARY OF THE INVENTION

In accordance with the present invention, an equipment enclosure having several features used to ensure proper installation is disclosed. The features provide for desirable simplicity and robustness in the installation process.

The disclosed enclosure includes features that enable an electronic component to be accurately aligned for proper mating with an L-shaped wall bracket. The bottom of the component rests on a base of the bracket. A rear wall of the bracket includes fastener elements, such as threaded standoffs for receiving respective screws, and alignment posts that extend forward beyond the standoffs. The rear of the component likewise includes fastener elements, such as captive screws, and alignment openings. During installation, the component is first brought into a partially installed position in which the alignment openings engage corresponding alignment posts, and then the component is pushed rearward until it abuts the rear wall of the bracket. By this action, the respective fasteners are mutually aligned so that the component can then be secured while being supported by the base of the wall bracket.

The disclosed enclosure also includes features that enable easy installation of a power supply or similar heavy item. The rear wall of a wall bracket includes a horizontal elongated hook support member and an alignment post, along with fastener elements such as threaded openings. A shelf-like assembly containing the power supply has a hook member on its rear wall, along with an alignment opening and fastener elements such as captive thumbscrews. During installation of the assembly, its hook member is brought into engagement with the hook support member of the wall bracket, in effect hanging the assembly on the rear wall of the wall bracket. From this initial position, the assembly is moved sideways until the alignment post of the wall bracket enters the alignment opening of the assembly, at which point the assembly rotates forward slightly to come into abutting relationship with the wall bracket. When the assembly is in this position, the fasteners are mutually aligned, and can then be fastened while the weight of the assembly is supported by the wall bracket.

Additional aspects, features and advantages of the present invention are also described in the following Detailed Description.

BRIEF DESCRIPTION OF THE SEVERAL VIEWS OF THE DRAWING

The invention will be more fully understood by reference to the following Detailed Description in conjunction with the Drawing, of which.

DETAILED DESCRIPTION OF THE INVENTION

Figure 1:
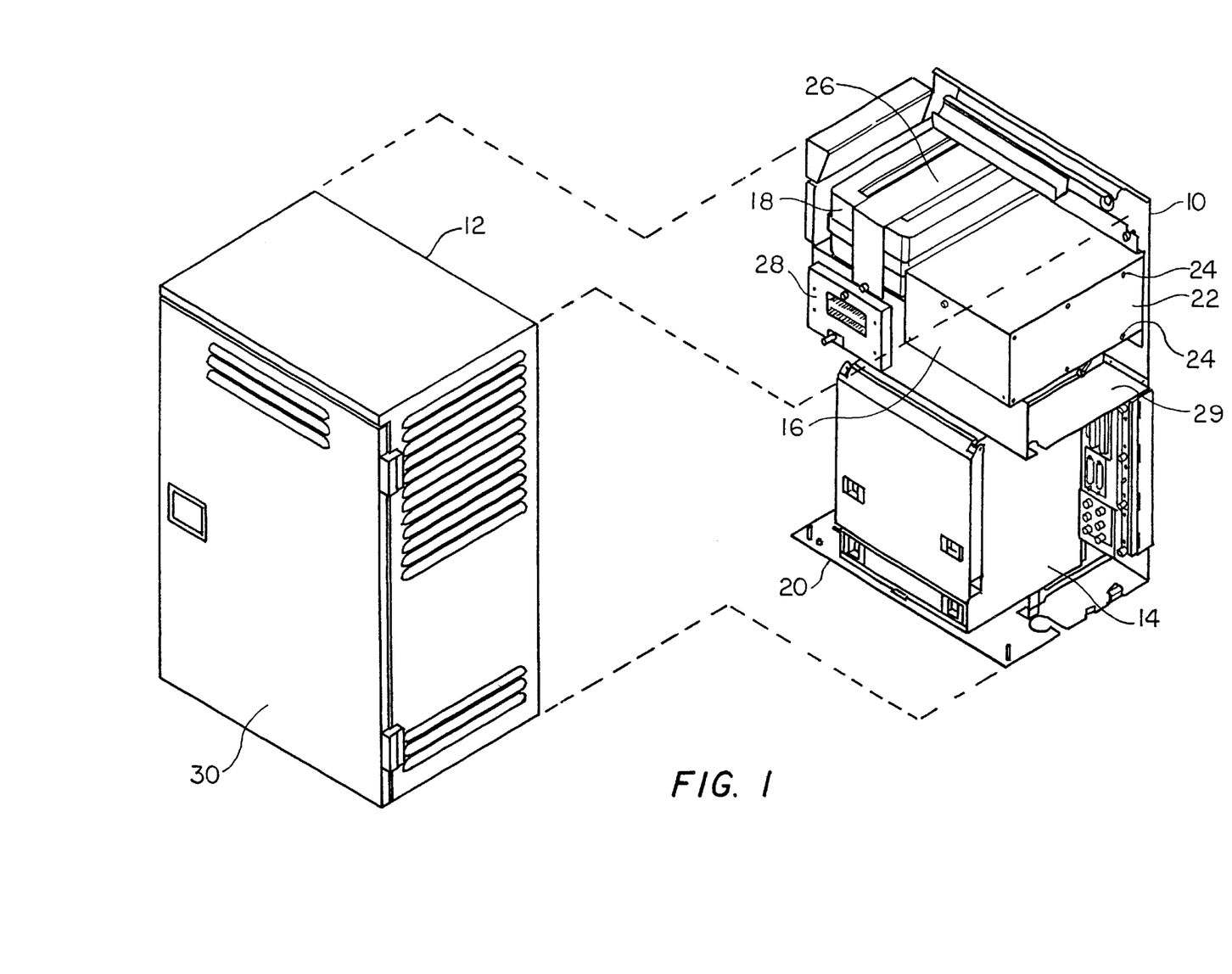
FIG. 1 is a perspective view of an electronic device assembly employing a wall mount enclosure in accordance with the present invention.

In FIG. 1, an electronic device is shown having a removable cover 12 and a number of mechanical and electrical components installed on a wall bracket 10 having an L-shaped cross section. The main electrical components include an electronic communications unit 14, a power supply 16, and a battery 18. The communications unit 14 rests on a horizontal base portion 20 of the wall bracket 10. The power supply 16 and battery 18 are included in a shelf assembly 22 secured to the upper rear portion of the bracket 10. The power supply 16 is secured in place via screws 24 extending through corresponding openings in the shelf assembly 22. The battery 18 is secured via an L-shaped battery bracket 26 in a manner described in more detail below. A removable patch panel 28 is attached to the front of a baffle assembly 29 over a corresponding opening (not shown in FIG. 1). The cover 12 includes a door 30 through which the various items attached to the wall bracket 10 are accessible when the cover 12 is installed thereon.

Figure 2:
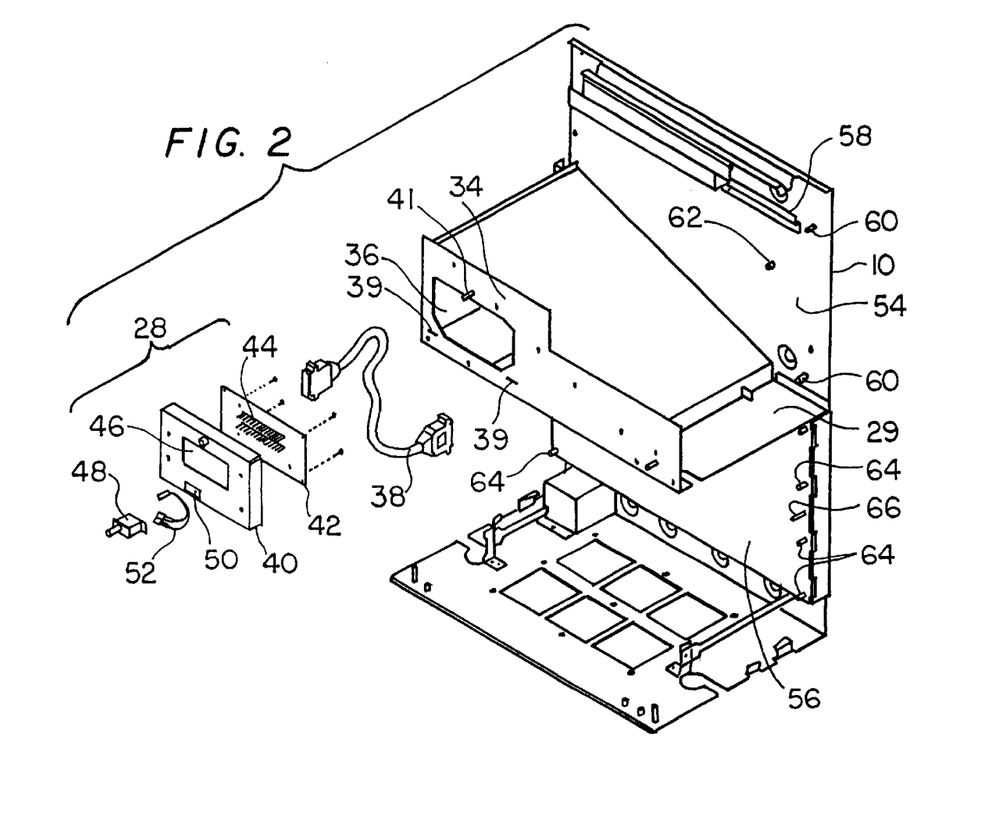
FIG. 2 is perspective exploded view of a wall mount bracket forming part of the enclosure of FIG. 1.

FIG. 2 shows several features of the wall bracket 10 and the patch panel 28 in greater detail. The baffle assembly 29 has a front-facing wall 34 to which the patch panel 28 is attached. The baffle wall 34 includes an opening 36 through which a cable 38 extends to provide interconnection between the patch panel 28 and other devices (not shown) in the unit. A pair of horizontal slots 39 are disposed near the lower corners of the opening 36, and a threaded standoff 41 is disposed near the top center of the opening 36.

The patch panel 28 includes a cover 40 and a mounting plate 42 secured to the cover 40 by rear-facing standoffs (not shown). The mounting plate 42 includes connectors 44 accessible from the rear and from the front via an opening 46 in the cover 40. A safety interlock switch 48 is attached to the cover 40 through a corresponding opening 50, and is connected to the connectors 36 by a wiring fixture 52. The interlock switch 48 is activated by the door 30 of the cover 12 (FIG. 1) to detect whether the door 30 is in an open or closed position.

As also shown in FIG. 2, the bracket 10 includes an upper wall portion 54 and a forward-projecting lower wall portion 56. The upper wall portion 54 has an attached hook support member 58, threaded standoffs 60, and an alignment post 62. The threaded standoffs 60 receive captive screws used to secure the shelf assembly 22 to the wall bracket 10, as described in more detail below. The alignment post 62 engages a corresponding opening in the rear of the shelf assembly 22 for purposes of alignment, as also described below. The lower wall portion 56 includes threaded standoffs 64 and alignment posts 66 (one visible in FIG. 2). The alignment posts 66 extend away from the wall portion 56 slightly further than do the threaded standoffs 64. The alignment posts 66 engage corresponding openings in the rear of the unit 14 for purposes of alignment, and the threaded standoffs 64 receive captive screws used to secure the electronic unit 14 of FIG. 1 to the wall bracket 10, as described in more detail below.

Figure 3:
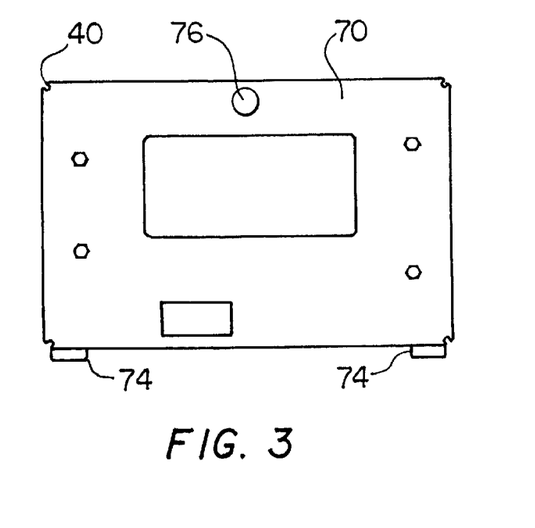
FIG. 3 is a front elevation view of a removable patch panel cover attached to the wall mount bracket of FIG. 2.
Figure 4:
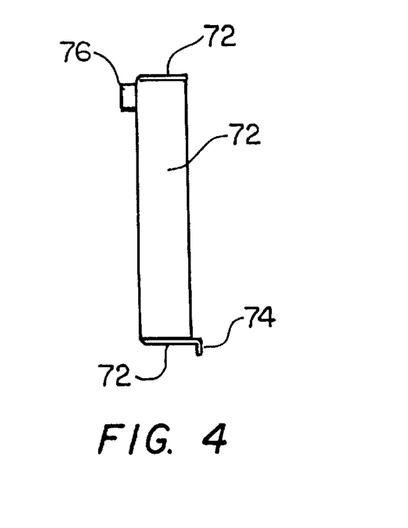
FIG. 4 is a side elevation view of the patch panel cover of FIG. 3.

FIGS. 3 and 4 show the patch panel cover 40 in greater detail. The cover 40 is made from a single cut-out sheet of cold-rolled steel, and is formed to have a front face portion 70 and rear-facing walls 72. At either end of the bottom wall 72 are a pair of bent tabs 74. At the top center of the face portion 70 cover 40 is a captive thumbscrew 76.

The patch panel 28 is installed in the following manner. The cable 38 is inserted through the opening 36 of the baffle front wall 34 and then connected to the rear of the connectors 44. The patch panel 28 is brought to a sufficiently horizontal (open) position to permit the tabs 74 to be placed into the respective slots 39 on the baffle front wall 34, and then rotated up to a vertical (closed) position. When the patch panel 28 is in the closed position, the thumbscrew 76 can be inserted into the standoff 41 on the baffle front wall 34 and then tightened. It will be appreciated that when the thumbscrew 76 is loosened, the patch panel 28 can be rotated to the open position as may be necessary for access to the connectors 44 or the cable 38. Once in the open position, the patch panel 28 can be removed by disconnecting the cable 38 and pulling the patch panel horizontally to remove the tabs 74 from the slots 39.

While in the illustrated embodiment the bottom of the illustrated patch panel 28 is secured to the baffle front wall 34 by two slots 39, other arrangements may be used in alternative embodiments. For example, it may be convenient to use only one slot, in which case it is preferably located more centrally with respect to the opening 36 rather than at one of the sides as shown. Additionally, it may be convenient to use more than two slots.

Figure 5:
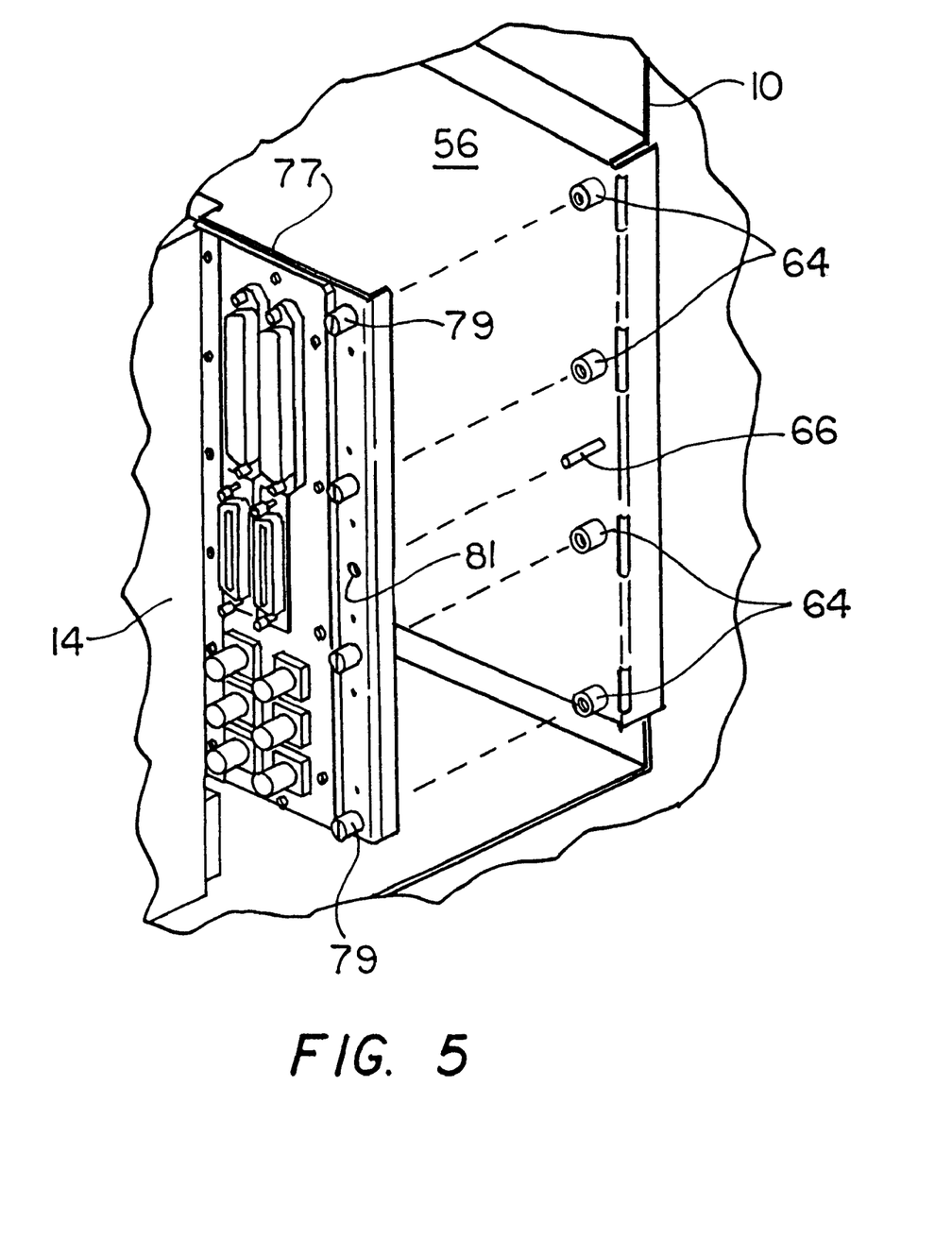
FIG. 5 is a perspective view of a front right lower portion of the assembly of FIG. 1.

FIG. 5 shows the manner in which the right side of the communications unit 14 is secured to the right side of the wall bracket 10. Although not shown in the Figures, the arrangement of FIG. 5 is repeated on the left side of the unit 14 and the wall bracket 10 as well. A backplane bracket 77 extends horizontally from the sides of the unit 14. The bracket 77 includes four captive thumbscrews 79 and an alignment opening 81. During installation, the unit 14 is first placed in roughly the position shown in FIG. 5, and then pushed generally rearward to complete its installation. When the bracket 77 meets the tips of the alignment posts 66 of the wall bracket 10, the unit 14 is prevented from sliding further rearward until it has been maneuvered into a substantially aligned position in which the tips of the alignments posts 66 just enter the alignment openings 81. From this position, the unit 14 is then pushed further rearward into an installed position in which the bracket 77 abuts the lower wall portion 56 of the wall bracket 10. At this point, the thumbscrews 79 are brought into engagement with the threaded standoffs 64 on the wall bracket 10 and tightened.

It will be appreciated that in alternative embodiments it may be convenient to place the alignment posts 66 on the rear of the unit 14 and the alignment openings 81 on the wall bracket 10.

Figure 6:
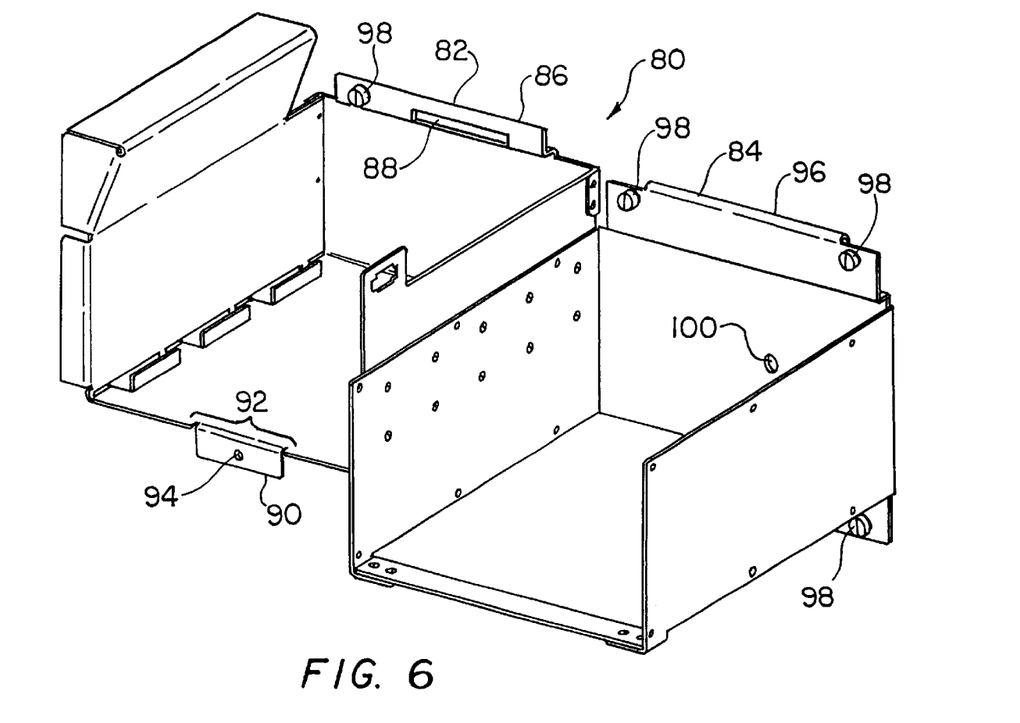
FIG. 6 is a perspective view of a power supply shelf in the electronic device assembly of FIG. 1.
Figure 7:
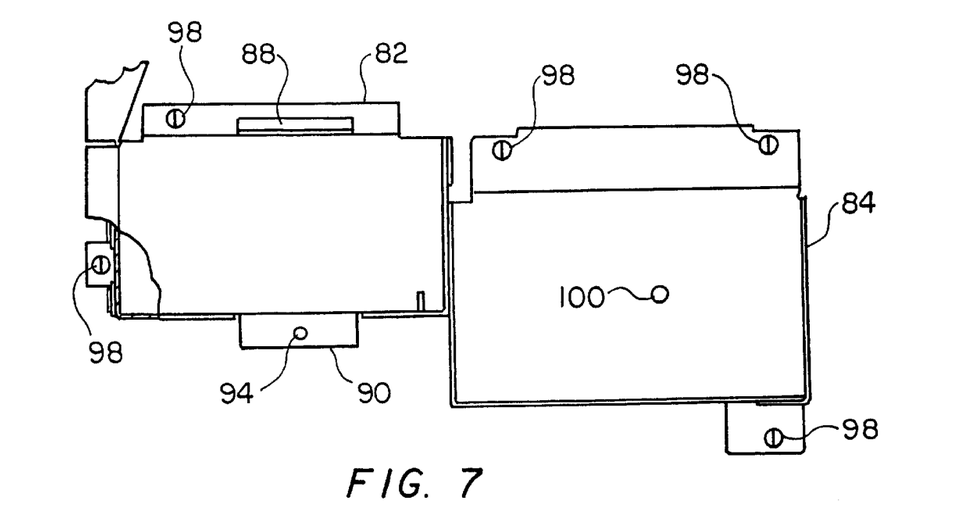
FIG. 7 is a top plan view of the power supply shelf of FIG. 6.
Figure 8:
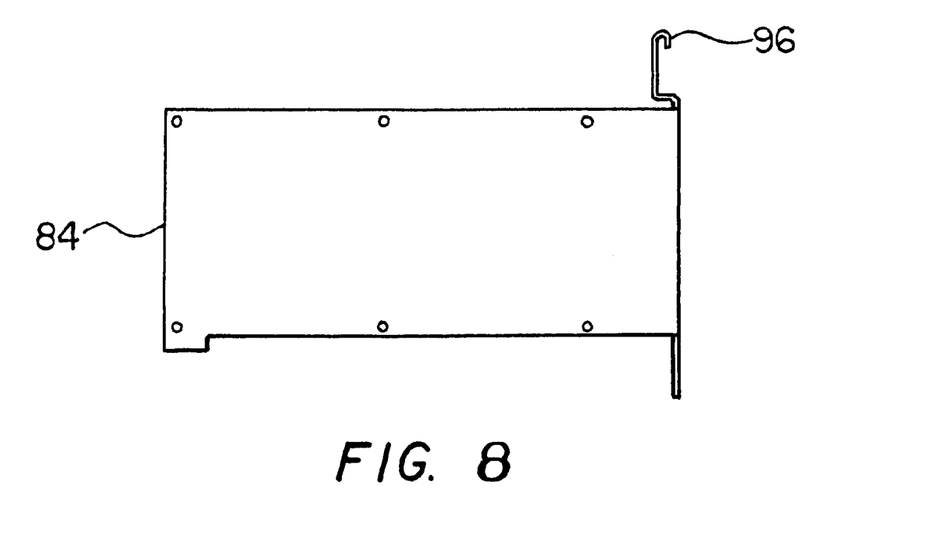
FIG. 8 is a side elevation view of a power supply box forming part of the power supply shelf of FIGS. 6 and 7.

FIGS. 6 and 7 show a perspective view and front view, respectively, of a shelf 80 that is the main structural element of the shelf assembly 22 of FIG. 1. The shelf 80 includes a battery box 82 attached to a power supply box 84. The battery box 82 includes an upper bent tab 86 having a horizontal slot 88 formed therein, and a lower bent tab 90 formed in the area of a front cutout 92. A threaded opening 94 is formed in the tab 90 for receiving a battery bracket thumbscrew as described below. The power supply box 84 includes a rear-facing hook portion 96, which is best seen in the side view of FIG. 8. The shelf 80 is secured to the wall bracket 10 of FIG. 1 by five floating captive screws 98, one of which is shown in a cutaway view of the lower left corner of the shelf 80. An alignment opening 100 is formed in the rear panel of the power supply box 84.

During installation of the shelf assembly 22, the power supply 16 is preferably installed into the power supply box 84 before the shelf 80 is attached to the wall bracket 10. The shelf 80 with the installed power supply 16 is then hooked onto the wall bracket 10 by placing the hook portion 96 into the hook support member 58 of the wall bracket 10 (FIG. 2). In general, at this stage the shelf 80 cannot lie flat against the wall bracket 10, due to interference between the rear wall of the power supply box 84 and the post 62 attached to the wall bracket 10 (FIG. 2). The shelf 80 is slid horizontally in either direction until the alignment post 62 enters the alignment opening 100, at which point the shelf 80 rotates down to an upright position in which its rear wall abuts the upper portion 54 of the wall bracket 10. At this point, the shelf 80 is oriented in its final installed position. The floating captive screws 98 are then manipulated to engage the threaded openings of the respective standoffs 60 on the wall bracket 10 (FIG. 2) to secure the shelf 80 in place.

Figure 9:
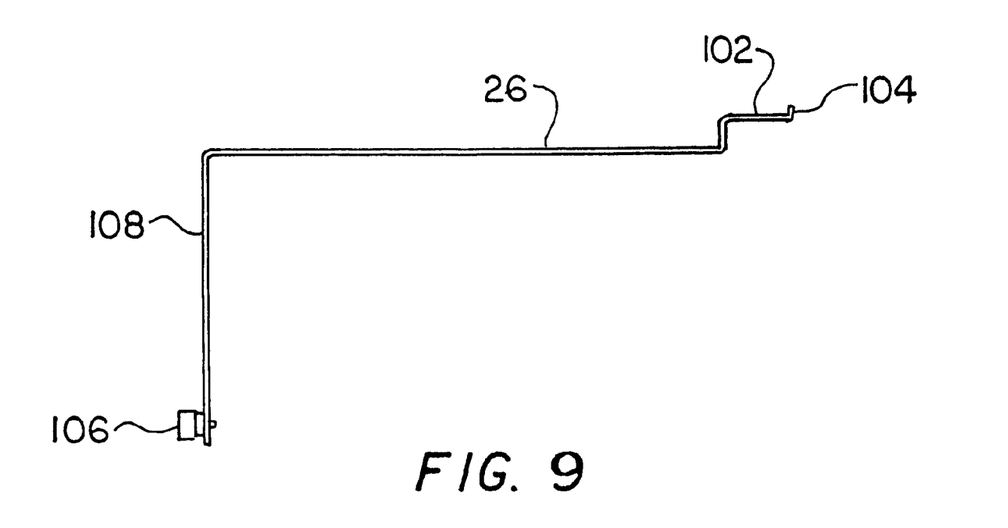
FIG. 9 is a side view of a battery tie-down bracket in the electronic device assembly of FIG. 1.

Either before or after installation of the shelf 80, the battery 18 can be placed in the battery box 82 and the battery bracket 26 installed in place to retain the battery 18 in position. As shown in FIG. 9, the battery bracket 26 includes a rear tab portion 102 having a slightly curved tip 104, and a captive thumbscrew 106 extending through a front portion 108 thereof. The battery bracket 26 is installed by placing the tab portion 102 into the slot 88 of the battery box 82 (FIG. 6) and then rotating the battery bracket 26 down such that the front portion 108 registers within the front cutout 92. This registration of the battery bracket 26 with the cutout 92 ensures that the battery bracket 26 is in the proper installed position, and permits the thumbscrew 106 to be easily manipulated to engage the threaded opening 94 for securing the battery bracket 26 to the battery box 82.

While various attachments are shown as being made using captive thumbscrews and corresponding threaded openings, other fastener arrangements may be used in alternative embodiments. It is also possible to utilize multi-piece assemblies in place of single-piece items formed by cutting and bending. For example, the battery box 82 of FIG. 6 may be formed from separate pieces that are welded together rather than from a single folded piece. Similarly, bent tabs on larger items may be replaced with flange pieces that are welded, riveted, or otherwise attached to the items.

Various installation features in a multi-component equipment enclosure having been described, it will be apparent to those skilled in the art that other modifications to and variations of the above are possible without departing from the inventive concepts disclosed herein, and therefore the invention should not be viewed as limited except to the full scope and spirit of the appended claims.

What is claimed is:

1. An electronic equipment unit, comprising two components disposed in an installed relationship, wherein:

one component is a support member having a substantially flat base and a substantially flat rear wall extending upwardly from the base, the rear wall including two horizontally spaced apart sets of fastener elements;

the other component is a sub-unit having a substantially flat bottom resting on the base of the support member and having a substantially flat back abutting the rear wall of the support member, the back of the sub-unit having two spaced-apart sets of fastener elements arranged such that respective fasteners of each set engage corresponding respective fasteners of a corresponding set of the fasteners on the support member;

a first one of the components includes two elongated alignment posts, each post being located adjacent to a corresponding set of fastener elements and extending toward the other component further than the fastener elements of the corresponding set; and a second one of the components includes two alignment openings into each of which extends a corresponding alignment post of the first component, the alignment openings being dimensioned and configured such that during installation the two components can be brought into a generally aligned relationship in which each alignment opening partially engages the corresponding alignment post and can then be urged together into the installed relationship.

2. An electronic equipment unit according to claim 1, wherein the alignment posts are located on the support member and the alignment openings are located on the sub-unit.

3. An electronic equipment unit according to claim 1, wherein the base and rear wall of the sub-unit are part of a housing within which electronic components are disposed.

4. An electronic equipment unit according to claim 1, wherein the rear wall of the support member is substantially perpendicular to the base of the support member.

5. An electronic equipment unit according to claim 1, wherein the fastener elements of one component are captive thumbscrews and the fastener elements of the other component are threaded openings for receiving the thumbscrews.

6. An electronic equipment unit, comprising:

a support structure dimensioned and configured to form a compartment for an electronic component within the unit, the support structure having an upper rear portion and a lower front portion, the upper rear portion having a slot extending along an upper rear boundary of the compartment, the lower front portion having an elongated cutout extending along a lower front boundary of the compartment in a direction substantially parallel to the slot, the lower front portion further including a flange disposed at the cutout and including a fastener element; and a retaining bracket disposed in an installed position with respect to the compartment, the retaining bracket having a front portion including a fastener element, the front portion being disposed in the cutout of the support structure such that the fastener element engages the fastener element of the support structure, the retaining bracket also having a rear portion disposed within the slot of the support structure, the rear portion including an upward-facing riser portion, a step portion, and an upward-facing tip portion extending from the step portion, the rear portion being configured such that (i) during installation of the retaining bracket the tip portion can be inserted into the slot of the support member and then rotated about the axis of the slot to the installed position, and (ii) in the installed position, the step portion of the retaining bracket extends through the slot of the support member and the retaining bracket is retained in the slot by the tip portion and the riser portion, and wherein the front portion is configured such that during installation of the retaining bracket the front portion engages the cutout of the support structure only when the retaining bracket is in the installed position.

7. An electronic equipment unit according to claim 6, wherein the flange at the lower front portion of the compartment is a bent tab.

8. An electronic equipment unit according to claim 6, wherein the fastener element of the retainer bracket is a captive thumbscrew and the fastener element of the flange is a threaded opening for receiving the thumbscrew.

9. An electronic equipment unit according to claim 6, wherein the retainer bracket has a substantially L-shaped cross section.

10. An electronic equipment unit according to claim 6, wherein the retaining bracket has a substantially flat body portion adjacent to the rear portion, and wherein (i) the riser portion is substantially perpendicular to the body portion, (ii) the step portion is substantially perpendicular to the riser portion, and (iii) the tip portion is substantially perpendicular to the step portion.

11. An electronic equipment unit, comprising:

a vertically disposed panel, the panel including (i) an elongated hook support member disposed horizontally on an interior surface thereof, (ii) fastener elements disposed on the interior surface thereof, and (iii) an alignment post on the interior surface thereof; and an electronic component disposed in an installed position on the panel, the component having an exterior wall abutting the interior surface of the panel, the exterior wall including (i) a hook member engaging the hook member of the panel, (ii) an alignment opening through which the alignment post of the panel extends, and (iii) fastener elements respectively engaging corresponding fastener elements of the panel, the hook member being cooperatively configured with the hook support member of the panel to retain the component against the panel during installation while permitting sliding motion of the component along the axis of the hook support member in an alignment phase of the installation, the exterior wall and the alignment opening being configured to (i) prevent the exterior wall of the component from abutting the interior surface of the panel during the alignment phase of the installation until the alignment post of the panel has engaged the alignment opening of the component, and (ii) prevent movement of the component along the axis of the hook support member once the alignment post of the panel has engaged the alignment opening of the component.

12. An electronic equipment unit according to claim 11, wherein the fastener elements of the electronic component are captive floating thumbscrews and the fastener elements of the panel are threaded openings for receiving the thumbscrews.

* * * * *

UNITED STATES PATENT AND TRADEMARK OFFICE
CERTIFICATE OF CORRECTION

PATENT NO.    : 6,443,322 B1
DATED         : September 3, 2002
INVENTOR(S)   : Willie Braun et al.

It is certified that error appears in the above-identified patent and that said Letters Patent is hereby corrected as shown below:

<u>Title page,</u>
Item [75], Inventors, "Willie Braun, Franklin Lake; Kan Liu, New York, both of NY (US);" should read -- Willie Braun, Franklin Lakes, NJ; Kan Liu, Flower Hill, NY (US); --.

Signed and Sealed this

Twelfth Day of August, 2003

JAMES E. ROGAN
*Director of the United States Patent and Trademark Office*